United States Patent [19]
Gundry

[11] Patent Number: 5,451,949
[45] Date of Patent: Sep. 19, 1995

[54] ONE-BIT ANALOG-TO-DIGITAL CONVERTERS AND DIGITAL-TO-ANALOG CONVERTERS USING AN ADAPTIVE FILTER HAVING TWO REGIMES OF OPERATION

[75] Inventor: Kenneth J. Gundry, San Francisco, Calif.

[73] Assignee: Dolby Laboratories Licensing Corporation, San Francisco, Calif.

[21] Appl. No.: 17,856

[22] Filed: Feb. 16, 1993

[51] Int. Cl.[6] .................................................. H03M 3/02
[52] U.S. Cl. ............................... 341/143; 341/139; 327/551; 333/14
[58] Field of Search ................... 341/139, 143; 381/98, 381/106; 375/30, 34; 333/172, 14; 328/167; 307/520, 521; 327/551, 553

[56] References Cited

U.S. PATENT DOCUMENTS

| | | | |
|---|---|---|---|
| 3,474,349 | 10/1969 | Ellermeyer | 328/167 |
| 3,805,091 | 4/1974 | Colin | 307/521 |
| 4,176,329 | 11/1979 | Moskowitz | 328/167 |
| 4,374,335 | 2/1983 | Fukahori et al. | 328/167 |
| 4,378,569 | 3/1983 | Dallas, Jr. et al. | 348/62 |
| 4,700,361 | 10/1987 | Todd et al. | 375/25 |
| 4,700,362 | 10/1987 | Todd et al. | 375/30 |
| 4,736,433 | 4/1988 | Dolby | 381/106 |
| 4,829,270 | 5/1989 | Anderson et al. | 333/14 |
| 4,829,299 | 5/1989 | Mandell | 341/77 |

FOREIGN PATENT DOCUMENTS

| | | |
|---|---|---|
| 56-112121 | 9/1981 | Japan . |
| 63-5611 | 1/1988 | Japan ........................ 333/172 |
| 2134357 | 8/1984 | United Kingdom . |

OTHER PUBLICATIONS

IEEE Transactions on Consumer Electronics, Nov. 1989, vol. 35, No. 4, New York, pp. 767–773: T. Ishikawa et al: "One–bit A/D D/A Converters IC for Audio Delay".
U. Tietze & Ch. Schenk, "Halbleiter–Shaltungstechnik," 1983, Springer Verlag, Berlin, pp. 398–401.
"Advanced Digital Audio," Ken C. Pohlmann, ed., SAMS, Carmel, Indiana, 1991 pp. 254–257.

*Primary Examiner*—Howard L. Williams
*Attorney, Agent, or Firm*—Thomas A. Gallagher; David N. Lathrop

[57] ABSTRACT

One-bit analog-to-digital converters (ADCs) and digital-analog-converters (DACs) employ an adaptive filter. The filter has two regimes of operation: variable gain within the passband of the filter under low-level signal conditions and fixed gain but a variable filter cutoff frequency (sliding band) under high-level signal conditions. Thus, excessive low-frequency gain under no-signal conditions is avoided and, when implemented using a voltage controlled amplifier (VCA), the arrangement does not demand less offset from the VCA under low-level signal conditions.

7 Claims, 5 Drawing Sheets

FIG._1A
(PRIOR ART)
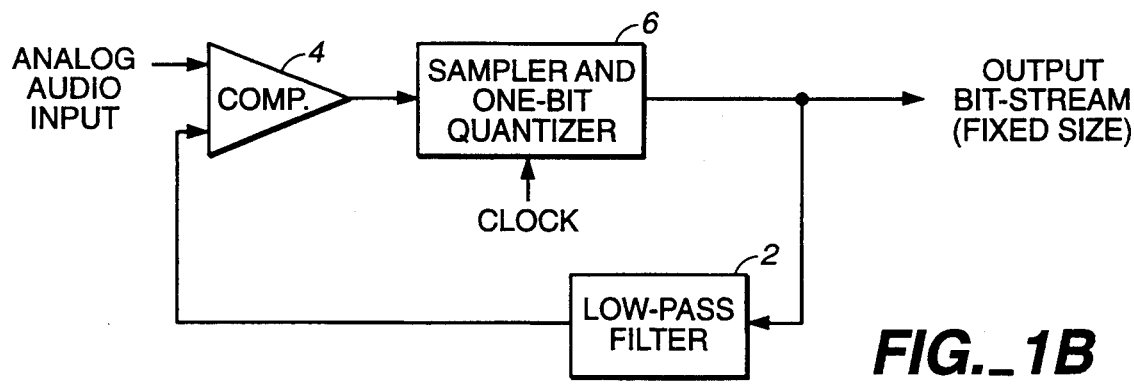
FIG._1B
(PRIOR ART)
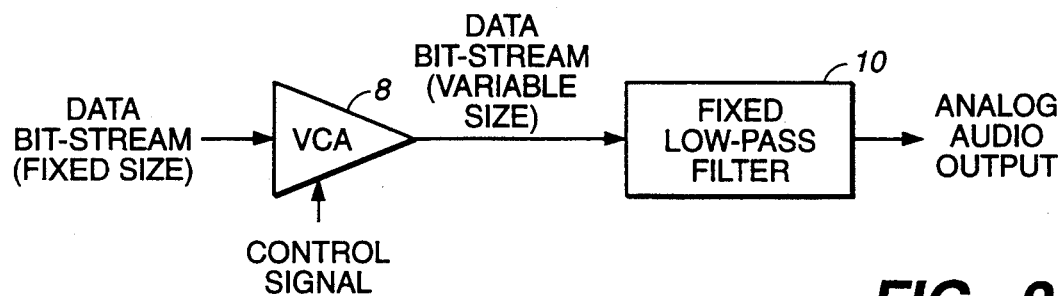
FIG._2A
(PRIOR ART)
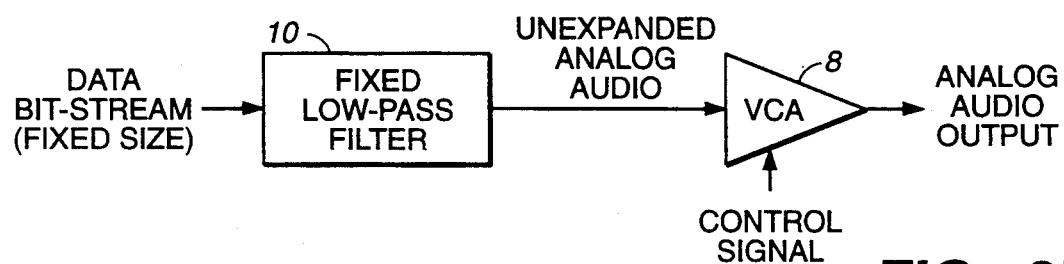
FIG._2B
(PRIOR ART)

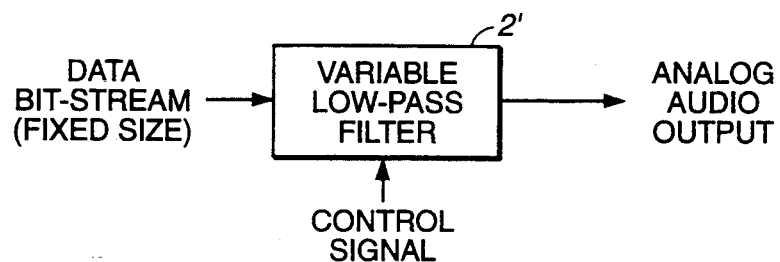
FIG._3
(PRIOR ART)
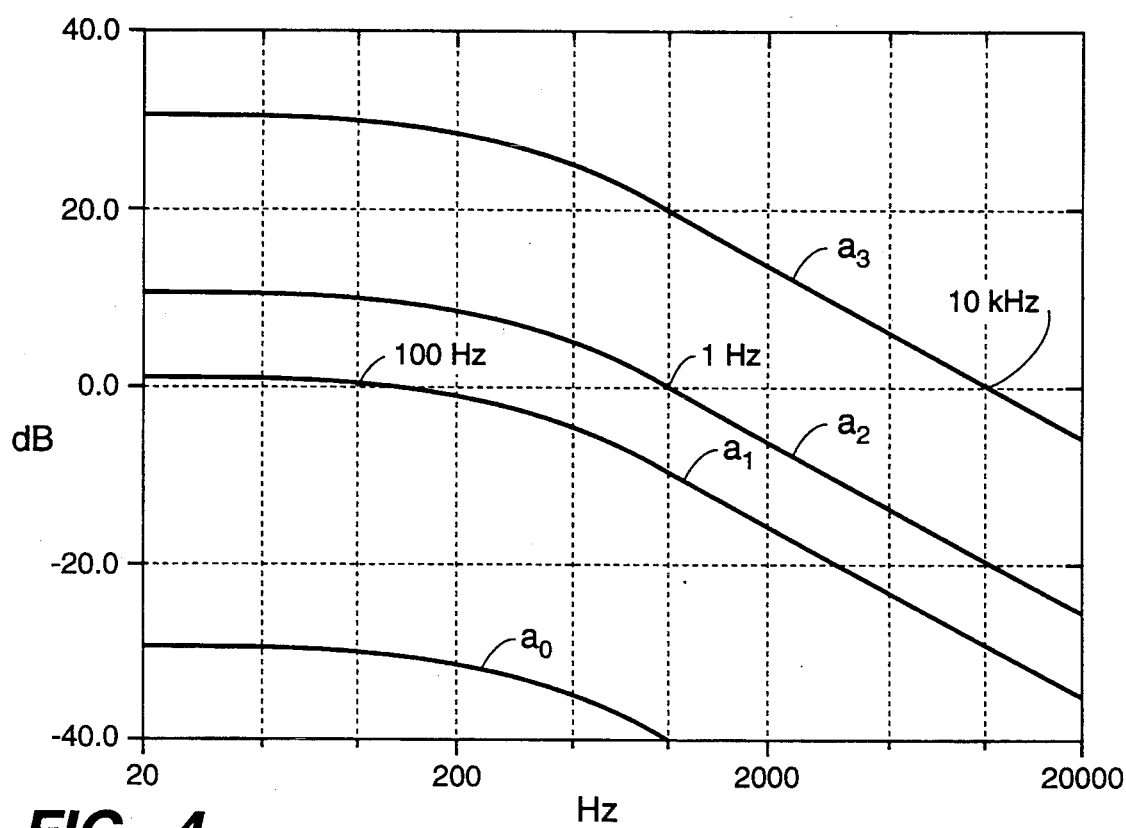
FIG._4
(PRIOR ART)

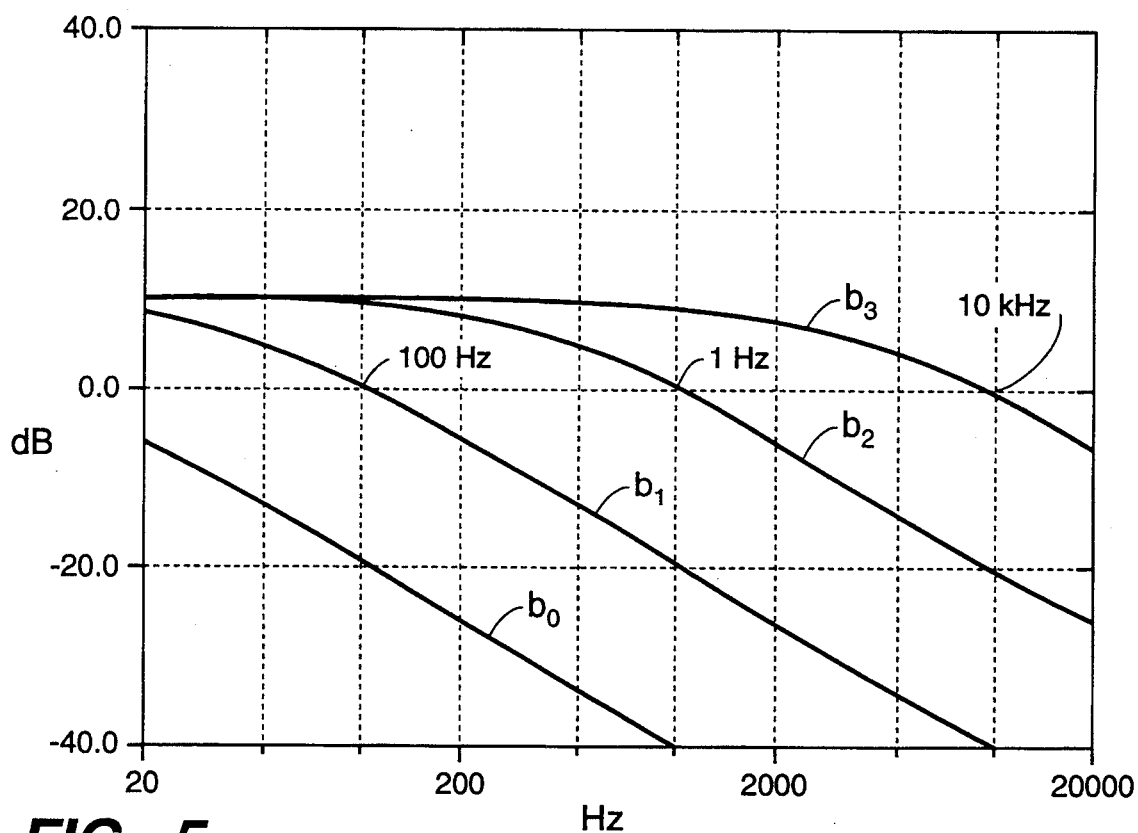
FIG._5
*(PRIOR ART)*
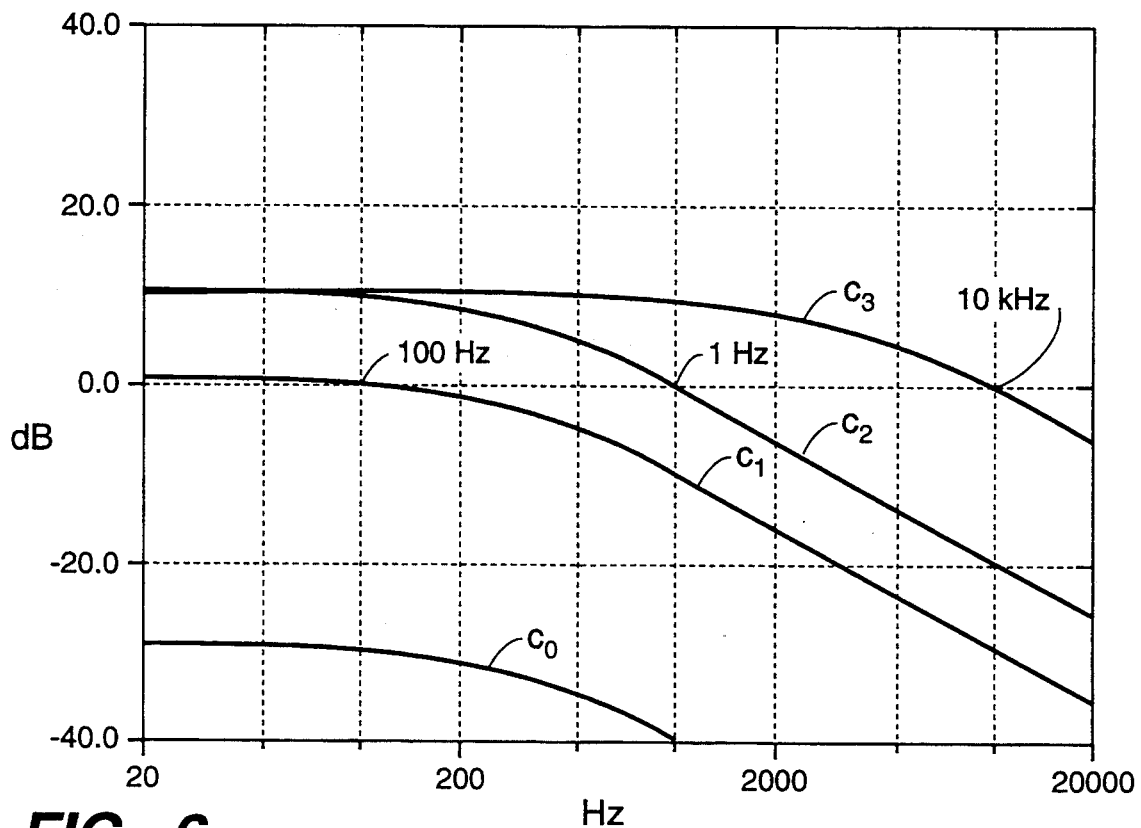
FIG._6

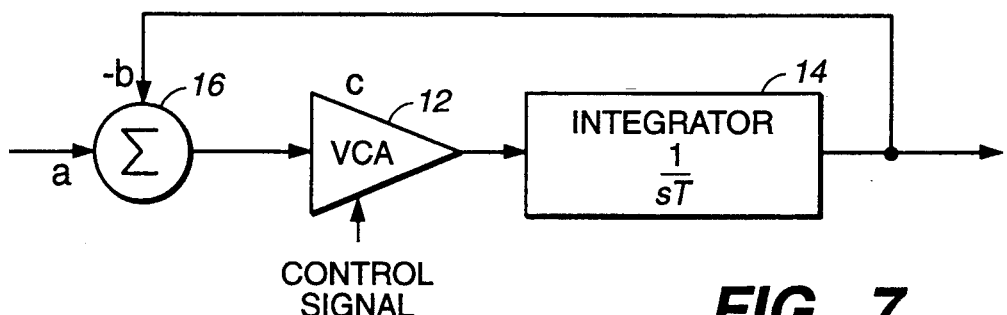
FIG._7
(PRIOR ART)
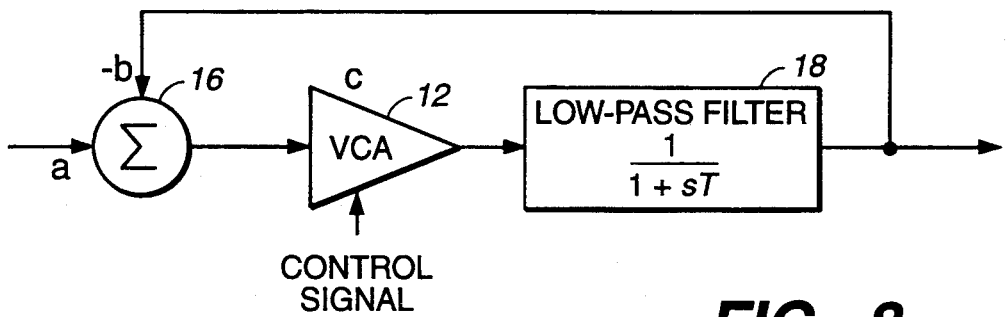
FIG._8
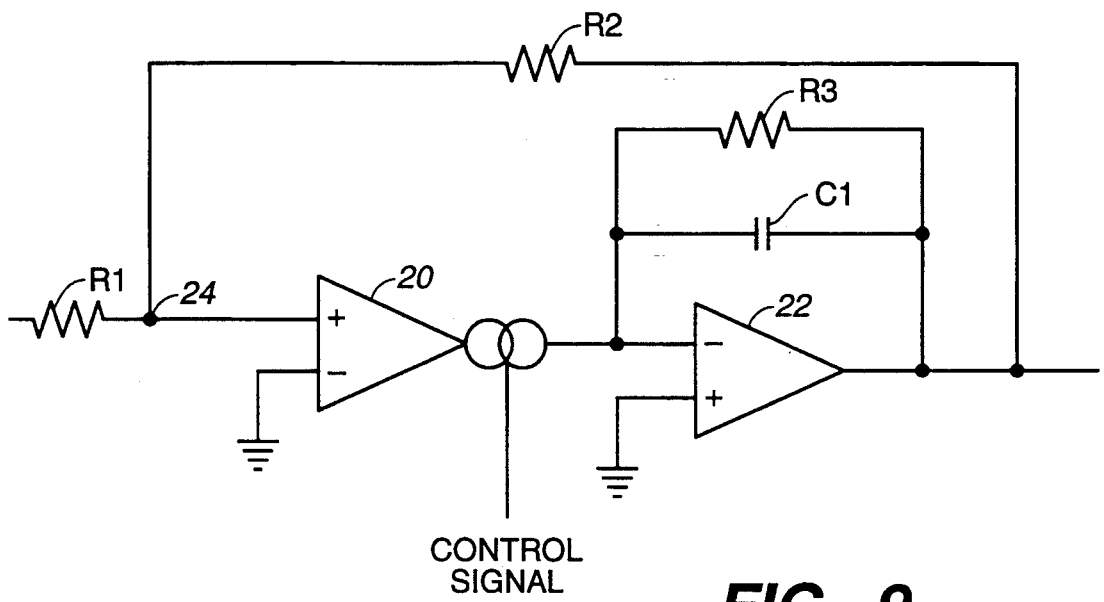
FIG._9

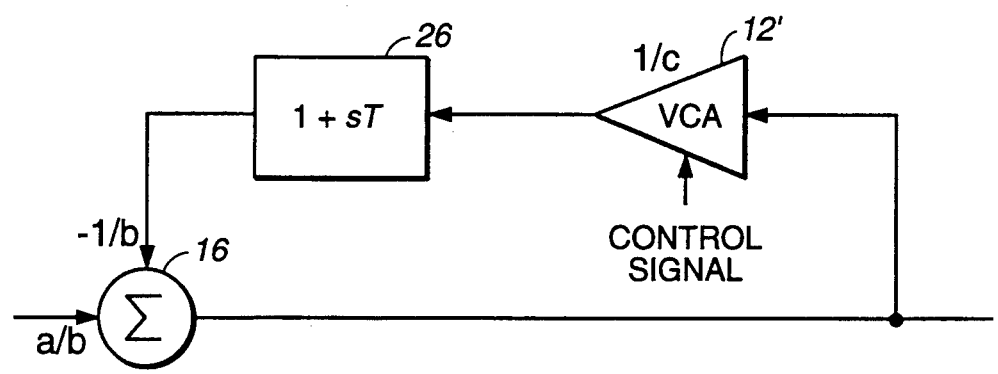
FIG._10
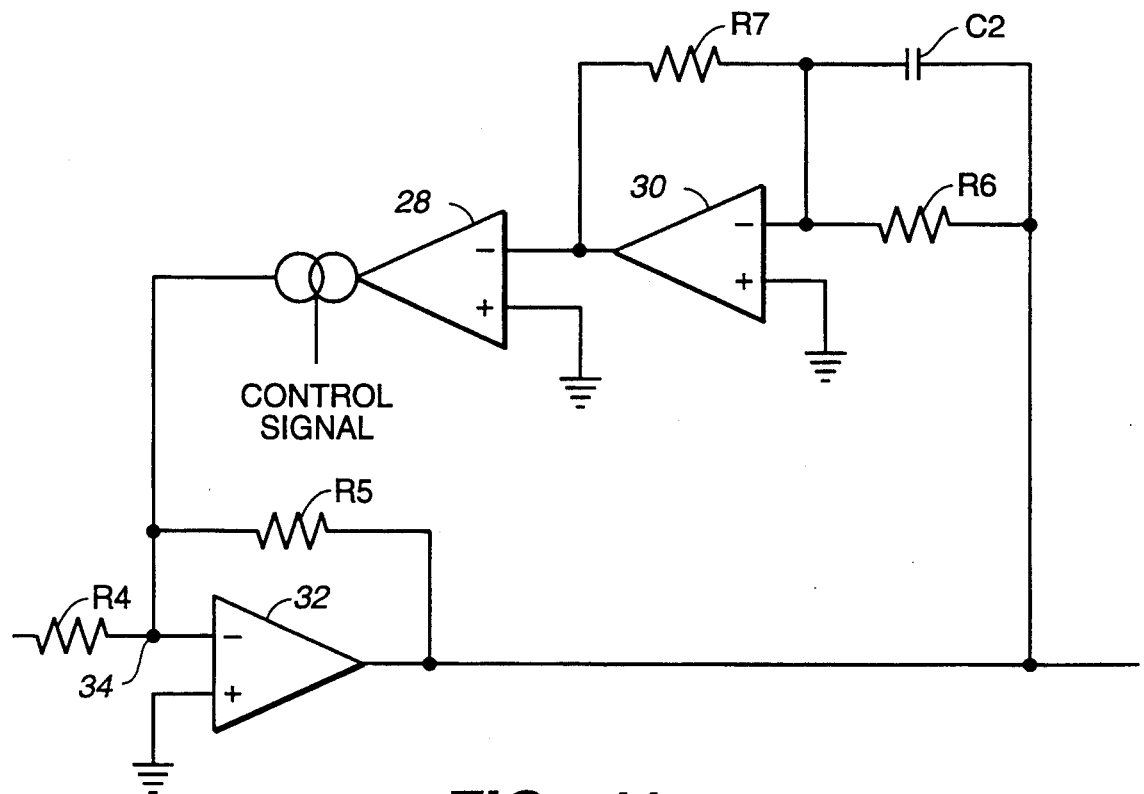
FIG._11

ONE-BIT ANALOG-TO-DIGITAL CONVERTERS AND DIGITAL-TO-ANALOG CONVERTERS USING AN ADAPTIVE FILTER HAVING TWO REGIMES OF OPERATION

BACKGROUND OF THE INVENTION

The invention relates to one-bit analog-to-digital converters (ADCs) and digital-to-analog converters (DACs). More particularly, the invention relates to such converters which employ an adaptive filter having two regimes or modes of operation.

One-bit digital systems have the great virtue that they do not require high precision components. The digital-to-analog converter (DAC) of a one-bit system consists simply of a low-pass filter 2 such as shown in FIG. 1a. The analog-to-digital converter (ADC), such as shown in FIG. 1b, generally consists of an identical filter 2, known as the local decoder, a comparator 4 comparing the analog input signal with the output of the local decoder, and a sampling system such as sampler and one-bit quantizer 6, typically implemented as a D flip-flop, clocked at regular intervals to deliver data pulses whose polarity (1 or 0) depends on whether the local decoder's output is positive or negative with respect to the input signal.

Because every ADC contains a DAC (a local decoder—usually just a filter), the following discussion is directed primarily to the filter itself. It will be understood that the filter is employed in an ADC or a DAC.

In the digital-to-analog converters of non-adapting one-bit systems, impulses are fed via a filter to yield the analog output signal. The impulses are of two amplitudes, corresponding to the 1 and 0 of a data bit (e.g., they might be +5 and −5 volts). The nature of the filter determines the type of one-bit system.

In Delta Modulation systems the filter is an integrator or a low-pass filter with a cut-off frequency below or near the bottom of the message band (the range of frequencies occupied by the signal to be conveyed), so that over that band the response of the filter falls progressively with increasing frequency, most commonly at 6 dB/octave.

In Delta-Sigma Modulation systems the filter is a low-pass filter with a cut-off frequency above or near the top of the message band, so that over that band the filter response is substantially flat. For example, in a system designed for high-quality audio where the message band might be 30 Hz to 15 kHz, a delta modulation system might use a single-pole filter with a cut-off at 100 Hz (often called a leaky integrator), while the filter of a delta-sigma modulation system might cut-off at 10 kHz.

One-bit systems may be adaptive. Presently known methods can be broadly divided into two types: amplitude variation and filter adaptation.

Amplitude variation is the method used in conventional adaptive delta modulation. The amplitude of the impulses is varied, either continuously or in discrete steps, before filtering. Control circuitry is designed so that increasing signal amplitude leads to increasing impulse amplitude. In the example of FIG. 2a, the size of the input pulses is modulated by a voltage-controlled amplifier (VCA) 8 which precedes a fixed low-pass filter 10, but other methods are possible. An alternative but equivalent configuration, shown in FIG. 2b, uses fixed amplitude impulses but follows the filter 10 by the VCA 8. Either approach yields a much improved signal-to-noise ratio for low-level signals, compared with a non-adapting system. The noise has a substantially constant spectrum but varies with signal level, being directly proportional to the pulse amplitude. This variation may be audible as noise modulation. It is particularly likely to be audible in the presence of high-frequency signals, which may mask the rise in noise at high frequencies but not the accompanying rise at low and middle frequencies.

The filter adaptation approach employs fixed amplitude pulses but varies the cut-off frequency of the filter, again either continuously or discretely. FIG. 3 shows such an arrangement having a variable low-pass filter 2'. Under no-signal or low-level conditions, the system is conventional delta modulation, generally with a filter frequency substantially below the bottom of the message band. As the signal level increases, the filter moves up but initially it still has a cut-off frequency below the message band. However, once the cut-off frequency is within the message band, the gain below the cut-off frequency becomes constant. Thus the system yields a noise spectrum which is variable, with much less low-frequency noise in the presence of high-frequency signals. At high signal levels the filter slides upwards in frequency to approach the top of the message band; the system changes from delta to delta-sigma modulation.

This technique of adapting the filter gives a better subjective signal-to-noise ratio in the presence of high-level high-frequency signals because under these conditions the low frequency gain of the filter is lower than that of an integrator, and therefore the noise spectrum contains less energy at low frequencies where there is little or no masking.

However, under no-signal conditions the filter is effectively a pure integrator over a wide range of frequencies from below to the top of the message band and beyond. Thus, compared with a system employing amplitude adaptation there is a greater amplification at very low frequencies and therefore a greater proportion of low frequency noise at the bottom of and below the audio spectrum.

This increased low-frequency noise may not of itself be a significant disadvantage since under these signal conditions the absolute filter gain in the audio band is small so the absolute noise level is low. In addition the human ear is very insensitive to low-level low-frequency sounds, so the extra low-frequency noise is unlikely to be audible.

However, the required voltage-controlled filter (VCF) will in practice employ some form of VCA. It is an undesirable property of most designs of VCA that a small proportion of the control signal is added to the controlled signal, so that even when trimmed to minimize the effect the output of the VCF may contain a voltage or current offset which varies with the position of the filter cut-off frequency. If the variable filter is effectively an integrator under small-signal conditions, this variable offset may be amplified excessively, yielding an audible "thump" on high-frequency transients and a visible displacement of the base-line when the output waveform is observed on an oscilloscope.

As explained above, compared with conventional (amplitude-) adaptive delta modulation, filter adaptation gives reduced audible noise modulation but demands better performance from the VCA used in the adapting circuit. In accordance with the present invention, an ADC or DAC employs an adapting filter which retains the advantage of the sliding low-pass filter under high-level conditions but does not demand less offset from the VCA under low-level conditions.

In addition, in accordance with the present invention, the advantage of the sliding band (variable filter cutoff frequency) is realized under high-level high-frequency conditions but without the excessive very low frequency gain under no-signal conditions, thus reducing very low-frequency noise in the quiescent or low-level state. Thus, ADCs and DACs in accordance with the invention provide the advantages of amplitude- and filter-adapting arrangements while avoiding their weak points.

SUMMARY OF THE INVENTION

To understand better the advantages of ADCs and DACs according to the present invention, particularly with respect to the adapting filter of such converters, it is useful to explain the behavior of the prior-art filters in more detail.

Consider the bitstream from a one-bit ADC, fully modulated with a sine wave whose frequency is swept across the whole audio spectrum. The modulation consists of a variation in the relative proportions of 1s and 0s, and full modulation means that at the maximum positive excursions of the modulating sine wave almost all bits are of one kind, say 1s, and at the maximum negative excursions almost all bits are of the other kind, 0s. At the zero crossings of the modulating sine wave, 1s and 0s occur with equal frequency. If such a bitstream is fed into a low-pass filter with a cut-off frequency at the top of the audio range, the output will be the swept sine wave with a constant amplitude. Such a filter constitutes a non-adapting delta-sigma DAC.

Consider the required behavior of an adaptive delta demodulator fed with the same bitstream, assuming that the output amplitude is again required to be constant with frequency.

If the adaptation is purely in amplitude (i.e., the size of the bits fed into a leaky integrator is variable, as in FIG. 2a), the transfer function from the input data to the analog output is a family of curves all of the same shape, a low-pass filter with a fixed cut-off near the bottom of the message band. To obtain a constant output from the fully modulated data, the gain must rise with increasing frequency (see FIG. 4). Curves a1, a2 and a3 show the required function to yield the same output at 100 Hz, 1 kHz and 10 kHz, respectively. Note that the gain, and therefore the noise, at say 100 Hz is much higher when the response has adapted to give the required output at 10 kHz. Curve a0 shows how the response might be when there is no modulation. The gain has fallen dramatically and hence the output noise is very small.

If the adaptation involves a sliding filter as in FIG. 3, curves b1, b2 and b3 of FIG. 5 show the required response to yield the same output at the same three frequencies, 100 Hz, 1 kHz and 10 kHz, respectively. Even with the high-level high-frequency signal, the gain at low frequencies does not rise more than a few dB (about 10 dB in the example shown) above that needed to reproduce low and middle frequencies, so the low-frequency noise does not rise excessively. Comparing curve b3 with a3, it can be seen that in the presence of 10 kHz the low-frequency gain and hence noise is about 20 dB lower. However, under no-signal conditions, the filter must slide down, for example to curve b0, in order to obtain low noise. Note that although the gain is now low in the middle of the audio band, where noise is most audible, it is much higher at the bottom of and below the message band; comparing curves b0 and a0, the gain at 1 kHz are the same, but the sliding filter has about 12 dB more gain at 20 Hz, and the difference continues to increase at frequencies below the audio band. This excess gain leads to higher noise at very low frequencies, not usually a problem in itself, and to undesired amplification of any variable offset in the variable filter circuit.

FIG. 6 shows a different family of adapting curves. The no-signal and "100 Hz" curves, c0 and c1, are identical with those of the amplitude adapter (FIG. 4, a0 and a1), but for further adaptation the system "slides" as in the curves of FIG. 5 (c2=b2, c3 =b3)(comparing curves "c" in FIG. 6 to curves "b" in FIG. 5). It will be apparent from FIG. 6 that the advantage of the sliding band (variable filter cutoff frequency) is realized under high-level high-frequency conditions but without the excessive very low frequency gain under no-signal conditions, thus reducing very low-frequency noise in the quiescent or low-level state. The characteristics shown in FIG. 6 thus provide the advantages of the amplitude- and filter-adapting arrangements while avoiding their weak points.

The differences in the adaptation approaches can be summarized as follows. In the variable amplitude arrangements, as explained by FIGS. 2a, 2b and 4, each curve in the family is reached by displacement along the gain axis, i.e., a vertical movement. In the variable filter comer frequency (sliding band) arrangement, as explained by FIGS. 3 and 5, each curve in the family is reached by displacement along the frequency axis, i.e., a horizontal movement. In an adaptive filter arrangement according to the present arrangement (FIG. 6 and the embodiments of FIGS. 8–11), the curves move initially up the gain axis (vertically) and subsequently along the frequency axis (horizontally)

FIG. 7 shows the block diagram of a typical embodiment of a prior art adapting filter. A forward path contains a VCA 12 and an integrator 14 in tandem, with overall negative feedback imposing a maximum forward gain. The VCA and integrator may occur in either order in FIG. 7 and in the embodiments of FIGS. 8–11, but practical considerations of noise and distortion normally require the order shown. The integrator has a transfer characteristic $$\frac{1}{sT}.$$

A control signal applied to VCA 12 varies its gain. The control signal is generally a function of the amplitude of the analog input signal to the ADC or the analog output signal of the DAC. As the amplitude of the analog signal increases, the control signal increases to increase the gain of the VCA. Circuits for generating control signals are well-known in the art.

A combiner 16 additively combines the input signal having amplification "a" with a signal at the output of the negative feedback path having amplification "−b". By standard analysis of the feedback system, the overall gain represented as an expression in Laplace transform notation is $$\frac{a}{b} \cdot \frac{1}{1 + \frac{sT}{bc}}.$$

This expression represents a low-pass filter with a constant gain in its passband of a/b and a cut-off frequency $$\frac{bc}{2\pi T},$$

which varies with the VCA gain c.

BRIEF DESCRIPTION OF THE DRAWINGS

FIG. 1a is a block diagram of a one-bit digital-to-analog converter (ADC).

FIG. 1b is a block diagram of a one-bit analog-to-digital converter (DAC).

FIG. 2a is a block diagram of one type of amplitude-adaptive delta demodulator.

FIG. 2b is a block diagram of another type of amplitude-adaptive delta demodulator, equivalent to the arrangement of FIG. 2a.

FIG. 3 is a block diagram of a frequency-adaptive delta demodulator.

FIG. 4 is a series of waveforms showing theoretical transfer functions of a one-bit DAC employing a variable amplitude filter.

FIG. 5 is a series of waveforms showing theoretical transfer functions of a one-bit DAC employing a variable frequency (sliding band) filter.

FIG. 6 is a series of waveforms showing theoretical transfer functions of a one-bit DAC employing an adaptive filter in accordance with the present invention.

FIG. 7 is a block diagram of a prior art DAC using a variable low-pass filter.

FIG. 8 is a block diagram of an adaptive filter for use in an ADC or a DAC in accordance with the present invention.

FIG. 9 is a more detailed block diagram of an adaptive filter for use in an ADC or a DAC in accordance with the present invention.

FIG. 10 is a block diagram of an alternative embodiment in which an arrangement substantially equivalent to an adaptive filter for use in an ADC or a DAC in accordance with the present invention is shown.

FIG. 11 is a more detailed block diagram of an alternative embodiment in which an arrangement equivalent to an adaptive filter for use in an ADC or a DAC in accordance with the present invention is shown.

DETAILED DESCRIPTION OF THE PREFERRED EMBODIMENTS

Referring now to FIG. 8, a variable filter for use in an ADC or a DAC in accordance with the present invention is shown. As mentioned above, such a filter is used in an ADC and a complementary DAC in the manner of FIGS. 1a and 1b. In the embodiment of FIG. 8, the integrator of FIG. 7 is replaced by a fixed low-pass filter 18 having a transfer characteristic $$\frac{1}{1 + sT}.$$

As in the FIG. 7 arrangement a control signal applied to VCA 12 varies its gain. The comments regarding the control signal in FIG. 7 also apply here. The overall gain of this circuit is $$\frac{ac}{1 + bc} \cdot \frac{1}{1 + \frac{sT}{1 + bc}}.$$

When the VCA gain is low so that $bc \ll 1$, this simplifies to $$ac \cdot \frac{1}{1 + sT}.$$

This expression is that of a low-pass filter at a fixed frequency $$\frac{1}{2\pi T}$$

having a gain in its passband of ac, i.e., variable and proportional to the VCA gain.

When the VCA gain is high so that $bc \gg 1$, the full expression reduces to $$\frac{a}{b} \cdot \frac{1}{1 + \frac{sT}{bc}}.$$

This is the same as the case for the integrator arrangement of FIG. 7; a sliding filter with a fixed passband gain of a/b and a variable cut-off frequency $$\frac{bc}{2\pi T}.$$

Hence, the configuration of FIG. 8 achieves the desired variable response, exhibiting as an ideal circuit, pure gain change for low values of c and pure sliding band for high values of c. The transition from one regime or mode of operation to the other occurs at a threshold where bc=1.

A preferred embodiment of the adaptive filter for use in ADCs and DACs of the present invention is shown in more detail in FIG. 9. As is the embodiment of FIG. 8, such a filter is used in an ADC and a complementary DAC in the manner of FIGS. 1a and 1b. The FIG. 9 embodiment uses a variable transconductance amplifier 20 (e.g., a National Semiconductor IC type LM13700) in series with an operational amplifier ("op. amp") 22. In the manner of FIG. 7 a control signal is applied to amplifier 20 to vary its gain. The comments regarding the control signal in FIG. 7 also apply here. The op. amp has a local feedback path with a capacitor C1 and a resistor R3 in parallel. The variable transconductance amplifier 20 functions in the manner of VCA 12 in FIG. 8 and its amplification is also varied by an control signal. The op. amp 22 and its local feedback path function in the manner of low-pass filter 18 in FIG. 8. Resistor R2 provides the negative feedback path to the node 24 at the positive input of amplifier 20. The input, fed through resistor R1, is summed with the output of the negative feedback path at the node 24.

The arrangement of FIG. 9 differs from the prior art in the addition of resistor R3, which converts the operational amplifier ("op. amp") from an integrator (in the absence of R3) to a fixed low-pass filter. This resistor lowers the impedance of the local feedback around the op. amp. at low frequencies (where C1 presents a high reactance), and hence reduces the amplification of any offset current emerging from the variable transconductance. The circuit of FIG. 9 has an overall transfer characteristic $$-g_m \cdot \frac{R_2 R_3}{R_1 + R_2} \cdot \frac{1}{1 + g_m \cdot \frac{R_1 R_3}{R_1 + R_2} + j\omega R_3 C_1}$$

where $g_m$ is the variable transconductance, proportional to the control signal. When $g_m$ is low, this simplifies to $$-g_m \cdot \frac{R_2 R_3}{R_1 + R_2} \cdot \frac{1}{1 + j\omega R_3 C_1},$$

which represents a fixed low-pass filter with a variable passband gain. When $g_m$ is high, the expression simplifies to $$-\frac{R_2}{R_1} \cdot \frac{1}{1 + j\omega \frac{(R_1 + R_2) C_1}{g_m R_1}},$$

which represents a low-pass filter of fixed gain but variable frequency. The transition or threshold between the two regimes or modes of operation occurs where $$g_m = \frac{R_1 + R_2}{R_1 R_3}.$$

An alternative preferred embodiment of a variable filter for use in an ADC or a DAC in accordance with the present invention is shown in FIG. 10. This alternative embodiment also provides two regimes of operation and also reduces the effect of variable offset resulting from shortcomings in VCAs. In this arrangement the variable filter characteristic is achieved by placing a "pre-emphasis" type network 26 in series with a VCA 12' in the feedback path instead of providing a low-pass filter in series with a VCA in the forward path as in the embodiment of FIG. 8. The embodiment of FIG. 8 is preferred inasmuch as the FIG. 10 embodiment is less convenient to implement, requiring additional amplifiers in order to provide a voltage output from VCA 12' rather than, as in FIG. 8, a current output which is normally provided by a VCA.

As in the previous embodiments, a control signal applied to the VCA varies its gain. However, the control signal acts in the opposite sense to that of the FIG. 8 embodiment. The comments regarding the control signal in FIG. 7 also apply here. Network 26 has a transfer characteristic $1 + sT$, which is the reciprocal of the FIG. 8 network 18 characteristic. The network 26 transfer characteristic is the sum of a fixed unity gain and a differentiator. Such a network is widely used to provide pre-emphasis in FM radio (where T is 75 μs in the United States) and is easily realizable.

A combiner 16 additively combines the input signal having amplification "+a/b" with a signal at the output of the negative feedback path having amplification "−1/b". VCA 12' has a gain of 1/c. The overall gain of the circuit is the same as that of the FIG. 8 embodiment, namely $$\frac{ac}{1 + bc} \cdot \frac{1}{1 + \frac{sT}{1 + bc}}.$$

As in the FIG. 8 embodiment, when $bc \ll 1$, this simplifies to $$ac \cdot \frac{1}{1 + sT},$$

however, this occurs when the VCA gain is high rather than low.

When the VCA gain is low so that $bc \gg 1$, the full expression reduces to $$\frac{a}{b} \cdot \frac{1}{1 + \frac{sT}{bc}}.$$

This is the same as the case for the integrator arrangement of FIG. 7; a sliding filter with a fixed passband gain of a/b and a variable cut-off frequency $bc/2\pi T$.

Hence, the configuration of FIG. 9 also achieves the desired variable response, exhibiting as an ideal circuit, pure gain change for low values of 1/c (rather than c) and pure sliding band for high values of 1/c (rather than c). The transition from one regime or mode of operation to the other occurs at a threshold where $bc = 1$. Because the control circuit acts in the opposite sense from that of the FIG. 8 embodiment, when the control signal is above a threshold the characteristic is that of a low-pass filter with a fixed cut-off frequency but with variable passband gain and when the control signal has a value below the threshold the characteristic is that of a low-pass filter with a variable cut-off frequency but a fixed passband gain. The FIG. 10 alternative preferred embodiment of a variable filter for use in an ADC or a DAC in accordance with the present invention is shown in more detail FIG. 11. A variable transconductance amplifier 28 (e.g., a National Semiconductor IC type LM13700) is located in series with an op. amp 30 in the negative feedback loop of op. amp 32. In the manner of the previously described embodiments, a control signal is applied to amplifier 28 to vary its gain. The comments regarding the control signal in FIG. 7 also apply here. The op. amp 30 has a local input and feedback path with a capacitor C2 and a resistor R6 in parallel and a resistor R7 in series to provide the pre-emphasis function. Op. amp 32 has a local feedback path with resistor R5. The input to the overall arrangement is fed through resistor R4 and additively combined at a summing node 34 with the output of the negative feedback path from the amplifier 28.

The circuit has an overall transfer characteristic $$-\frac{R_5}{R_4} \cdot \frac{1}{1 + g_m \cdot \frac{R_5 R_7}{R_6} (1 + j\omega R_6 C_2)},$$

where $g_m$ is the variable transconductance, proportional to the control signal. When $$g_m \cdot \frac{R_5 R_7}{R_6} \gg 1,$$

this simplifies to $$-\frac{1}{g_m} \cdot \frac{R_6}{R_4 R_7} \cdot \frac{1}{1 + j\omega R_6 C_2},$$

which represents a fixed low-pass filter with a passband gain which varies inversely with $g_m$. When $g_m$ $$g_m \cdot \frac{R_5 R_7}{R_6} << 1,$$

the expression simplifies to $$-\frac{R_5}{R_4} \cdot \frac{1}{1 + j\omega g_m R_5 R_7 C_2},$$

which represents a low-pass filter of fixed gain but variable frequency. The transition or threshold between the two regimes or modes of operation occurs where $$g_m \cdot \frac{R_5 R_7}{R_6} = 1.$$

The invention may be implemented using circuit arrangements and topologies other than those specifically disclosed. In addition, although analog embodiments are disclosed, the invention may be implemented either wholly or partially in the digital domain. Although a purely digital implementation would not be subject to the VCA offset current problem which is solved by analog embodiments of the invention, digital implementations share with analog implementations the advantages of the two regimes of operation and the reduction in very low-frequency noise in the quiescent or low-level state.

I claim:

1. An adaptive one-bit audio digital-to-analog converter comprising combining means receiving input dam pulses applied to the converter and signals from a negative feedback path for additively combining the input signals and the negative feedback path signals, and signal path means including a forward path receiving the output of said combining means and providing at its output the output of the converter and the input to the negative feedback path, and a negative feedback path coupling the output of said forward path to said combining means, said signal path means further including a variable gain amplifier and a filter having a fixed frequency-dependent response, said combining means and signal path means forming an adaptive low-pass filter having two regimes of operation, one in which the characteristic is that of a low-pass filter with a fixed cut-off frequency but with variable passband gain and another in which the characteristic is that of a low-pass filter with a variable cut-off frequency but a fixed passband gain.

2. An adaptive one-bit audio analog-to-digital converter comprising local decoder means, said local decoder means including combining means receiving input data pulses applied to the local decoder means and signals from a negative feedback path for additively combining the input signals and the negative feedback path signals, and signal path means including a forward path receiving the output of said combining means and providing at its output the output of the local decoder means and the input to the negative feedback path, and a negative feedback path coupling the output of said forward path to said combining means, said signal path means further including a variable gain amplifier and a filter having a fixed frequency-dependent response, said combining means and signal path means forming an adaptive low-pass filter having two regimes of operation, one in which the characteristic is that of a low-pass filter with a fixed cut-off frequency but with variable passband gain and another in which the characteristic is that of a low-pass filter with a variable cut-off frequency but a fixed passband gain, and means for comparing and sampling input analog signals with respect to signals from said local decoder means to provide output data pulses having a polarity (1 or 0) depending on whether the local decoder signal is positive or negative with respect to the input signal.

3. Apparatus according to claim 1 or claim 2 wherein the filter characteristic of the adaptive low-pass filter varies in response to a control signal applied to said variable gain amplifier such that when the control signal has values on one side of a threshold the characteristic is that of a low-pass filter with a fixed cut-off frequency but with variable passband gain and when the control signal has values on the other side of the threshold the characteristic is that of a low-pass filter with a variable cut-off frequency but a fixed passband gain.

4. Apparatus according to claim 3 in which said signal path means further includes an operational amplifier in series with said variable transconductance amplifier, said operational amplifier and variable transconductance amplifier located in said forward path.

5. Apparatus according to claim 4 wherein said operational amplifier has resistance ($R_3$) and capacitance ($C_1$) in parallel in its feedback path, such that the resistance lowers the impedance of the feedback path of the operational amplifier at low frequencies and, hence, reduces the amplification of any offset current produce by the variable transconductance amplifier.

6. Apparatus according to claim 5 wherein said adaptive low-pass filter has an overall transfer characteristic represented by the expression $$-g_m \cdot \frac{R_2 R_3}{R_1 + R_2} \cdot \frac{1}{1 + g_m \cdot \frac{R_1 R_3}{R_1 + R_2} + j\omega R_3 C_1} \Big/$$

where $g_m$ is the variable transconductance proportional to the control signal, $R_2$ couples said negative feedback path to said combining means, $R_1$ couples said input data pulses to said combining means, whereby when $g_m$ is low the expression representing the overall transfer characteristic simplifies to the expression.

$$-g_m \cdot \frac{R_2 R_3}{R_1 + R_2} \cdot \frac{1}{1 + j\omega R_3 C_1},$$

which represents a fixed low-pass filter with a variable gain, and when $g_m$ is high, the expression representing the overall transfer characteristic simplifies to the expression $$-\frac{R_2}{R_1} \cdot \frac{1}{1 + j\omega \frac{(R_1 + R_2)C_1}{g_m R_1}},$$

which represents a low-pass filter of fixed gain but variable frequency, and the transition between the two regimes of operation occurs where $$g_m = \frac{R_1 + R_2}{R_1 R_3}.$$

7. Apparatus according to claim 3 in which said signal path means further includes an operational amplifier in series with said variable transconductance amplifier, said operational amplifier and variable transconductance amplifier located in said negative feedback path.

* * * * *

UNITED STATES PATENT AND TRADEMARK OFFICE
CERTIFICATE OF CORRECTION

PATENT NO. : 5,451,949
DATED : 9/19/95
INVENTOR(S) : Kenneth Gundry

It is certified that error appears in the above-identified patent and that said Letters Patent is hereby corrected as shown below:

Column 4 line 30 of the patent, "comer" should be --corner--;

Column 9 line 36 of the patent, "dam" should be --data--;

Column 10 line 44 of the patent, "produce" should be --produced--;

Column 10 line 51 of the patent, "/" should be deleted after the equation.

Signed and Sealed this

Tenth Day of March, 1998

Attest:

BRUCE LEHMAN

Attesting Officer

Commissioner of Patents and Trademarks